United States Patent
Lim et al.

(10) Patent No.: US 7,192,883 B2
(45) Date of Patent: Mar. 20, 2007

(54) METHOD OF MANUFACTURING SEMICONDUCTOR DEVICE

(75) Inventors: Tae Jung Lim, Ichon-Shi (KR); Sang Wook Park, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 112 days.

(21) Appl. No.: 11/009,712

(22) Filed: Dec. 13, 2004

(65) Prior Publication Data

US 2005/0208771 A1  Sep. 22, 2005

(30) Foreign Application Priority Data

Mar. 22, 2004  (KR) .................. 10-2004-0019479

(51) Int. Cl.
*H01L 21/461* (2006.01)
*H01L 21/302* (2006.01)
(52) U.S. Cl. ............... 438/745; 438/756; 438/757
(58) Field of Classification Search ............... None
See application file for complete search history.

(56) References Cited

U.S. PATENT DOCUMENTS

| | | | | |
|---|---|---|---|---|
| 4,122,215 A | * | 10/1978 | Vratny | ............... 438/614 |
| 4,269,654 A | * | 5/1981 | Deckert et al. | ............... 438/756 |
| 4,853,344 A | * | 8/1989 | Darmawan | ............... 438/426 |
| 2004/0102005 A1 | * | 5/2004 | Dong et al. | ............... 438/257 |
| 2004/0241941 A1 | * | 12/2004 | Shin | ............... 438/257 |

FOREIGN PATENT DOCUMENTS

KR  1020040002196  1/2004

* cited by examiner

*Primary Examiner*—Duy-Vu N. Deo
(74) *Attorney, Agent, or Firm*—Mayer Brown Rowe & Maw LLP

(57) ABSTRACT

The present invention relates to a method of manufacturing a semiconductor device. A minute pattern is formed using a hard mask film of a series of a nitride film as an etch mask. Before a hard mask film removal process is performed, the step of performing given etching using an oxide film etchant is added to remove an abnormal oxide film on the nitride film. It is thus possible to effectively remove the hard mask film. Generation of voids in a pattern below the hard mask film can be also effectively prevented using BOE in which the composition ratio of HF and $NH_4F$ and an etching temperature are optimized as an oxide film etchant.

5 Claims, 4 Drawing Sheets

METHOD OF MANUFACTURING SEMICONDUCTOR DEVICE

BACKGROUND

1. Field of the Invention

The present invention relates to a method of manufacturing a semiconductor device, and more specifically, to technology in which problems of devices generated when a polysilicon film is patterned using a nitride film as a hard mask can be solved.

2. Discussion of Related Art

Generally, in the process of manufacturing a semiconductor device, a minute pattern is formed using a photoresist film. As the aspect ratio of the pattern becomes large and the level of integration increases, however, there is a problem in that patterning becomes difficult with only the photoresist film. Therefore, patterning is performed using a film having an etch ratio that is higher than an underlying film to be patterned as a hard mask film. That is, in order to pattern a polysilicon film or an oxide film, the nitride film is used as the hard mask film.

A polysilicon film or an oxide film is deposited on a semiconductor substrate and a nitride film is then deposited. After the nitride film is patterned, an etching process using the nitride film as an etch mask is performed to pattern the polysilicon film or the oxide film. A nitride film removal process is performed to remove the nitride film. The polysilicon film or the oxide film is thus patterned.

In the conventional nitride film removal process, a phosphoric acid dip-out process is employed in which the nitride film is removed by dipping the semiconductor substrate into a phosphor acid aqueous solution of a high temperature. During the phosphoric acid dip-out process, however, an abnormal oxide film is formed on the nitride film. Thus, there is a problem in that the nitride film is not fully removed. In the case where an excessive nitride film removal process is performed in order to solve this problem, this leads to damage of an underlying pattern. For this reason, it has a great influence upon patterns such as a polysilicon film formed at the bottom.

SUMMARY OF THE INVENTION

Accordingly, the present invention has been made in view of the above problem, and it is an object of the present invention to provide a method of manufacturing a semiconductor device in which the step of performing predetermined etching using an oxide film etchant is added to a nitride film removal process in order to remove an abnormal oxide film on a nitride film, wherein damage of an underlying structure due to the etchant is prevented through control of the ratio of the etchant.

To achieve the above object, according to the present invention, there is provided a method of manufacturing a semiconductor device, comprising the steps of forming a hard mask film of a series of a nitride film on a pattern film that can easily react with an oxide film etchant chemically, patterning the hard mask film and then performing an etching process using the patterned hard mask film an etch mask to etch the pattern film, performing an etching process using a BOE solution in which HF and $NH_4F$ are mixed to remove a native oxide film formed on the hard mask film, wherein voids are prevented from being formed in a portion of the pattern film below the hard mask film, and performing a phosphoric acid dip-out process to remove the hard mask film.

It is preferred that a polysilicon film or an oxide film is used as the pattern film.

According to the present invention, there is provided a method of manufacturing a semiconductor device, comprising the steps of depositing a tunnel oxide film, a first conductive film and a first hard mask film on a semiconductor substrate, patterning the first hard mask film using an isolation mask and then etching the first conductive film, the tunnel oxide film and the semiconductor substrate using the patterned first hard mask film as an etch mask to form a trench for isolation, burying the trench with an oxide film and then performing a polishing process using the first hard mask film as a stop film to form an isolation film, performing an etching process using a BOE solution in which HF and $NH_4F$ are mixed to remove the oxide film remaining on the first hard mask film, wherein voids are prevented from being formed in a portion of the pattern film below the hard mask film, performing a first hard mask film removal process to remove the remaining first hard mask film, forming a second conductive film and a second hard mask film on the whole structure, patterning the second hard mask film and then etching the second conductive film using the patterned second hard mask film as an etch mask, performing an etching process using a BOE solution in which HF and $NH_4F$ are mixed to remove the oxide film formed on the second hard mask film, wherein the etching process is carried out by controlling the ratio of $NH_4F$ within the BOE solution and raising a temperature of the BOE solution, and performing a second hard mask film removal process to remove the remaining second hard mask film, thus forming a floating gate electrode consisting of the first and second conductive films.

It is preferred that the etching process using the BOE solution in which HF and $NH_4F$ are mixed is performed under the condition where the composition ratio of HF and $NH_4F$ is 1:7 to 1:10 when a temperature of the BOE solution is 15 to 26° C.

It is preferable that the etching process using the BOE solution in which HF and $NH_4F$ are mixed is performed under the condition where the composition ratio of HF and $NH_4F$ is 1:4 to 1:7 when a temperature of the BOE solution is 26 to 40° C.

The method preferably further comprises the step of performing an ion implant process to form an ion layer for preventing the leakage current through the sidewall of the trench after the step of forming the trench for isolation.

It is preferred that the first and second conductive films are formed using a polysilicon film, and the first and second hard mask films are formed using a nitride film.

DETAILED DESCRIPTION OF PREFERRED EMBODIMENTS

Figure 1:
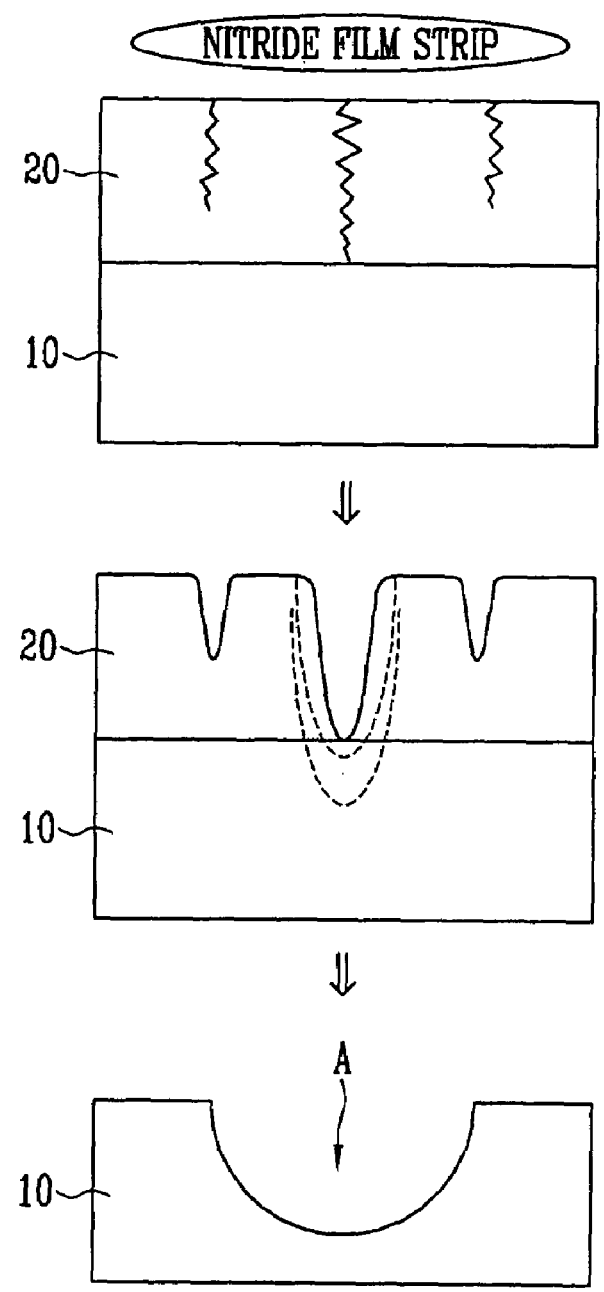
FIG. 1 is a cross-sectional view of a device shown to explain that voids are formed by an oxide film etchant upon nitride film removal process.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Like reference numerals are used to identify the same or similar parts.

A nitride film removal process of the present invention includes removing an oxide film formed on a nitride film using an oxide film etchant and then removing the nitride film using a phosphoric acid.

Figure 2:
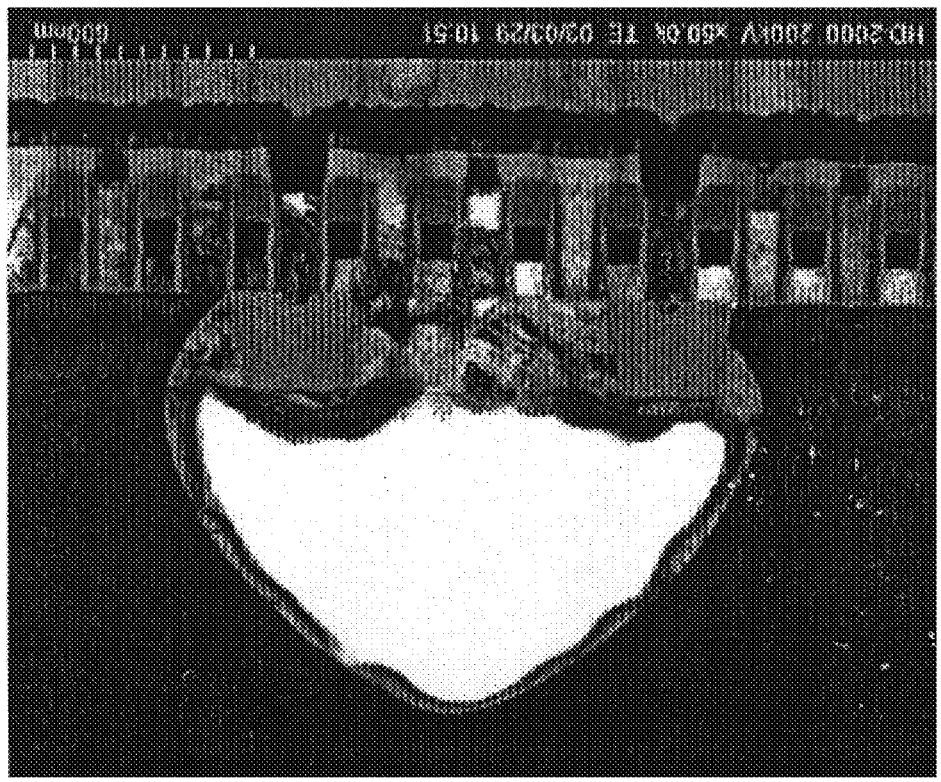
FIG. 2 is a scanning electron microscope (SEM) photograph.

FIG. 1 is a cross-sectional view of a device shown to explain that voids are formed by an oxide film etchant upon nitride film removal process. FIG. 2 is a SEM photograph.

Referring to FIG. 1 and FIG. 2, when an oxide film is removed, an oxide film etchant is infiltrated through cracks created in a nitride film 20. This oxide film etchant causes damage to a polysilicon film 10 or an oxide film below the nitride film 20. If the nitride film 20 is removed using a phosphoric acid, there is a problem in that voids are formed on a patterned polysilicon film 10 or the oxide film.

According to the present invention, it is possible to effectively remove only the oxide film on the nitride film 20 through control of the concentration ratio of the oxide film etchant and a temperature of the etchant. In this embodiment, it is preferred that BOE in which HF and $NH_4F$ are mixed is used as the oxide film etchant, wherein the composition ratio of HF and $NH_4F$ is 1:7 to 1:10 when a temperature is 15 to 26° C. and the composition ratio of HF and $NH_4F$ is 1:4 to 1:7 when a temperature is 26 to 40° C.

This will be described with reference to the accompanying drawings.

FIGS. 3A to 3D are cross-sectional views shown to explain a method of manufacturing a semiconductor device according to a preferred embodiment of the present invention.

Figure 3A:
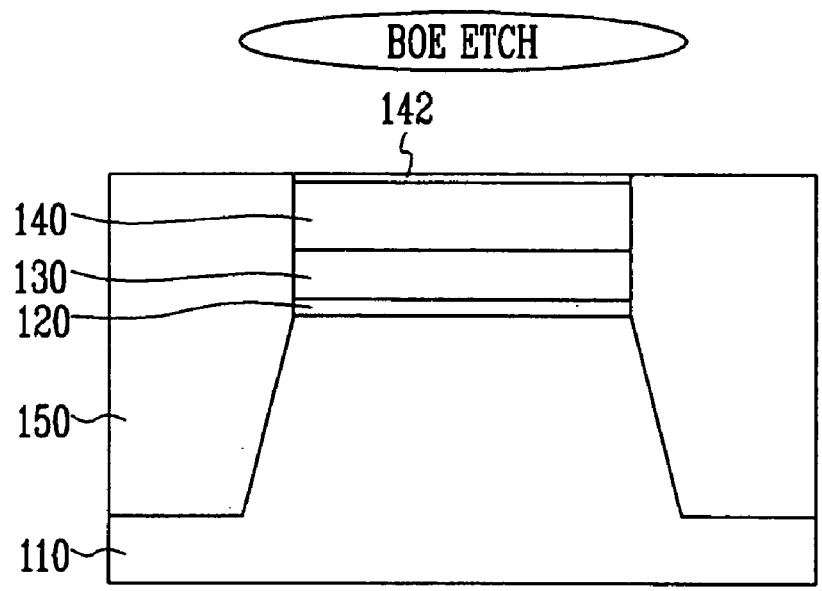
FIGS. 3A to 3D are cross-sectional views shown to explain a method of manufacturing a semiconductor device according to the present invention.

Referring to FIG. 3A, a tunnel oxide film 120, a first conductive film 130 and a first hard mask film 140 are sequentially deposited on a semiconductor substrate 110. The first hard mask film 140 is patterned using an isolation mask. An etching process using the patterned first hard mask film 140 as a mask is performed to etch the first conductive film 130, the tunnel oxide film 120 and the semiconductor substrate 110, thereby forming a trench for isolation (not shown). The trench is buried with an oxide film and is then polished to form an isolation film 150.

An etching process using BOE in which the composition ratio of HF and $NH_4F$ and an etching temperature are optimized is performed to remove an oxide film 142 remaining on the first hard mask film 140.

This will be described as follows in a more detailed manner.

An ion implant process for controlling the threshold voltage is performed to form a well and an ion layer for controlling the threshold voltage (not shown) in the semiconductor substrate 110. It is preferred that the well includes a triple well, an N well and a P well. The tunnel oxide film 120, the first conductive film 130 and the first hard mask film 140 are formed on the semiconductor substrate 110 in which the well and the ion layer for controlling the threshold voltage are formed.

Before the tunnel oxide film 120 is deposited, a pretreatment cleaning process can be carried out using DHF (Dilute HF) in which $H_2O$ and HF are mixed in the ratio of 50:1 and SC-1 (Standard Cleaning-1) composed of $NH_4OH$, $H_2O_2$ and $H_2O$, or BOE (Buffered Oxide Etch) in which $NH_4F$ and HF are mixed in the ratio of 100:1 to 300:1 and SC-1 composed of $NH_4OH$, $H_2O_2$ and $H_2O$.

It is preferred that the tunnel oxide film 120 is formed 30 to 100 Å in thickness at a temperature of 750 to 850° C. by means of a dry or wet oxidization process.

The first conductive film 130 can be formed using a polysilicon film that will be used as a portion of a floating gate through a subsequent process. The first conductive film 130 is deposited by means of a chemical vapor deposition (CVD), low pressure CVD (LPCVD), plasma enhanced CVD (PECVD) or atmospheric pressure CVD (APCVD) method. The first conductive film 130 can be deposited 300 to 500 Å in thickness.

The first hard mask film 140 is formed using a material film of a series of a nitride film and serves to protect an underlying structure when a trench is etched subsequently. The first hard mask film 140 can be formed in thickness of 900 to 1200 Å. The first hard mask film 140 can be formed using a SiON film.

A photoresist film is deposited on the first hard mask film 140. A photolithography etching process using an isolation mask is then performed to form a photoresist film pattern (not shown) through which an isolation region is opened. An etching process using the photoresist film pattern as an etch mask is performed to pattern the first hard mask film 140. A given removal process is then carried out to remove the photoresist film pattern. An etching process using the patterned first hard mask film 140 as an etch mask is performed to sequentially etch the first conductive film 130, the tunnel oxide film 120 and the semiconductor substrate 110, thereby forming a trench for isolation (not shown). The etching process using the first hard mask film 140 as the etch mask includes performing dry etching using plasma.

After the trench is etched, a sidewall oxidization process for compensating for etching damage of the trench sidewall is performed. A field oxide film is deposited on the whole structure and a polishing process using the first hard mask film 140 as a stop film is then carried out to form an isolation film 150. In this time, the field oxide film can be deposited on the whole structure in which the trench is formed using a HDP oxide film having a thickness of 4000 to 6000 Å, in consideration of the margin of a subsequent polishing process, wherein empty spaces are not formed within the trench. The polishing process may include performing CMP using the first hard mask film 140 as the stop film. Further, after the trench is formed, a predetermined ion implant process is performed to form an ion implant layer for preventing the leakage current through the trench sidewall.

The oxide film 142 remaining on the first hard mask film 140 is removed using a BOE solution in which HF and $NH_4F$ are mixed. In the present invention, it is possible to effectively remove only the oxide film 142 remaining on the first hard mask film 140 by relatively increasing the ratio of $NH_4F$ within the BOE solution in which HF and $NH_4F$ are mixed or raising a temperature.

Cracks are formed in the first hard mask film 140 due to the above process, i.e., the plasma etching process or ion implant process. Accordingly, if the oxide film 142 formed on the first hard mask film 140 is removed using the BOE solution that does not affect the composition ratio of HF and $NH_4F$, the BOE solution is infiltrated through the cracks of the first hard mask film 140. For this reason, a portion of the underlying first conductive film is etched to generate voids, as described with reference to FIGS. 1 and 2.

In the present invention, if the temperature of the BOE solution is 15 to 26° C., it is preferred that etching is performed under the condition where the composition ratio of HF and $NH_4F$ is 1:7 to 1:10. Furthermore, if the temperature of the BOE solution is 26 to 40° C., etching is preferably carried out under the condition in which the composition ratio of HF and $NH_4F$ is 1:4 to 1:7. It is more preferred that the etching is performed under the condition in which the temperature of the BOE solution is 24 to 26° C. and the composition ratio of HF and $NH_4F$ is 1:7.4 to 1:9.4. It is more effective that the etching carried out under the condition in which the temperature of the BOE solution is 35 to 39° C. and the composition ratio of HF and $NH_4F$ is 1:4.4 to 1:6.4. Most preferably, the etching can be performed under the condition where the temperature of the BOE solution is 24.5 to 25.5° C. and the composition ratio of HF and $NH_4F$ is 1:7.9 to 1:8.9. Also, the etching can be performed under the condition where the temperature of the BOE solution is 36 to 38° C. and the composition ratio of HF and $NH_4F$ is 1:4.9 to 1:5.9.

This is because the oxide film 142 on the first hard mask film 140 cannot be removed effectively if the temperature of the BOE solution and the composition ratio of HF and $NH_4F$ are lower than the aforementioned temperature and composition ratio and voids are generated if the temperature of the BOE solution and the composition ratio of HF and $NH_4F$ are higher than the aforementioned temperature and composition ratio. That is, reaction between the polysilicon film used as the first conductive film 130 and the BOE solution is largely dependent upon the ratio of $NH_4F$ and HF in the BOE solution. The following chemical equation represents reaction between silicon and BOE.

Initial reaction (buffer ox etch)

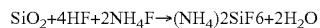

Bunker propagation reaction (c-Si etch)

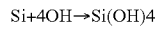

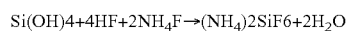

That is, it is possible to prevent generation of voids by relatively decreasing or increasing the ratio of $HF_4F$ or controlling the temperature. According to the present invention, it is thus possible to remove the oxide film 142 remaining on the first hard mask film 140 and to prevent generation of voids due to BOE by performing the etching process using BOE in which the composition ratio of HF and $NH_4F$ and the etching temperature are optimized.

The degree in which the BOE solution is mixed will be described as follows. If the temperature of BOE is 15 to 26° C., it is preferred that HF, $NH_4F$ and DI water within BOE are mixed in the ratio of 3.5 to 4.5%, 17 to 23%, and 72.5 to 79.5%, respectively. If the temperature of BOE is 26 to 40° C., it is preferred that HF, $NH_4F$ and DI water within BOE are mixed in the ratio of 6 to 8%, 36 to 40%, and 52 to 58%, respectively.

Figure 3B:
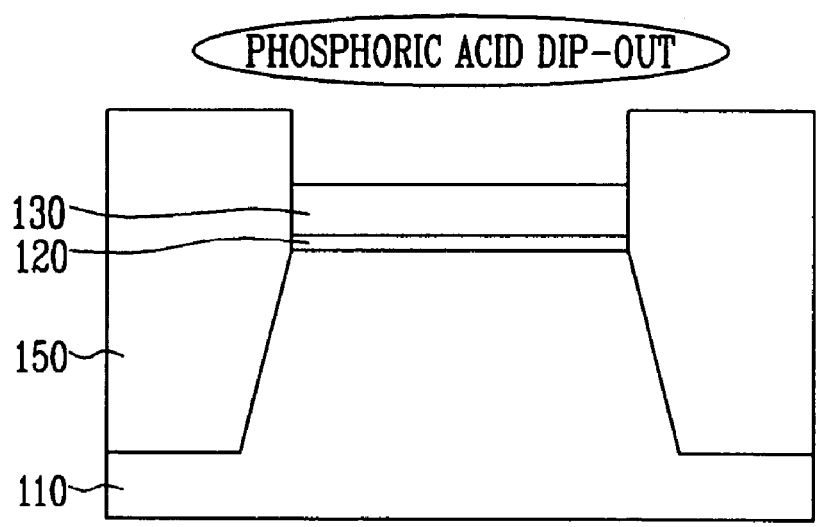

Referring to FIG. 3B, a first hard mask film 140 removal process is performed to remove the remaining first hard mask film 140. It is preferred that a phosphoric acid dip-out process using a phosphoric acid ($H_3PO_4$) aqueous solution is performed as the removal process. This is because the nitride film is used as the first hard mask film 140. The removal process of the first hard mask film 140 includes removing the remaining first hard mask film 140 by dipping out the semiconductor substrate into the phosphor acid aqueous solution. At this time, the dip-out type can be various depending on a process condition. In this embodiment, since the oxide film removing process using BOE is performed before the removal process, the nitride film can be completely exposed to the phosphor acid aqueous solution.

Figure 3C:
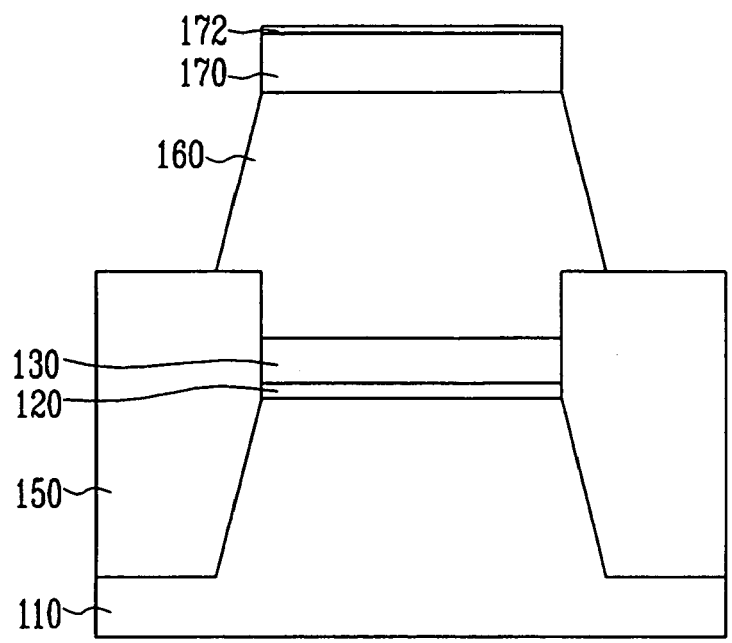
Figure 3D:
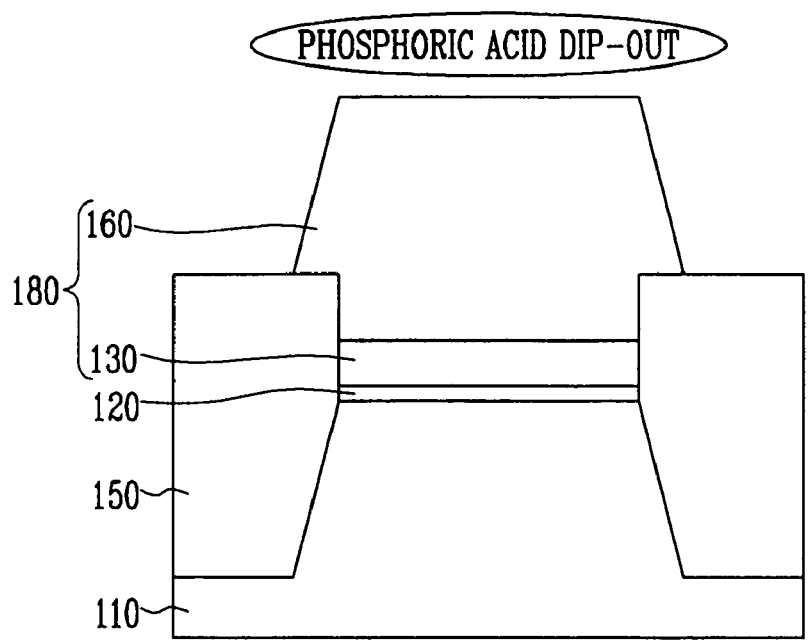

Referring to FIG. 3C and FIG. 3D, a second conductive film 160 and a second hard mask film 170 are formed on the whole structure. After the second hard mask film 170 is patterned, the second conductive film 160 is etched using the patterned second hard mask film 170 as an etch mask. An etching process using BOE is carried out to remove an oxide film 172 on the second hard mask film 170. A second hard mask film 170 removal process is then performed to remove the remaining second hard mask film 170. A floating gate electrode 180 having the first conductive film 130 and the second conductive film 160 is thus completed.

It is preferred that a predetermined cleaning process is performed in order to remove a native oxide film and an impurity on the underlying first conductive film 130 before the second conductive film 160 is deposited. This is for solving problems occurring due to the impurity at the interface since the floating gate electrode according to the present invention has two layers such as the first conductive film 130 and the second conductive film 160. Further, a polysilicon film can be used as the second conductive film 160 and a nitride film can be used as the second hard mask film 170. In the present invention, the reason why the underlying conductive film is patterned using the hard mask film is to protect an underlying structure. Further, this is because it is difficult to form a minute pattern having a high step using only the photoresist film since the design rule of a device is reduced.

After a photoresist film is coated on the second hard mask film 170, a photoresist film pattern (not shown) for a floating gate electrode is formed through a photolithography etching process. The second hard mask film 170 is etched using the photoresist film pattern as an etch mask. The photoresist film pattern is then removed by means of a given removal process.

A plasma dry etching process using the second hard mask film 170 as an etch mask is carried out to etch the second conductive film 160. The floating gate electrode 180 having the first and second conductive films 130 and 160 is thus completed. Since the plasma dry etching process is performed at high temperature, an unwanted native oxide film is formed on the second hard mask film 170. Accordingly, as described above, it is preferred that the oxide film 172 remaining on the second hard mask film 170 is removed by performing the etching process using BOE in which the composition ratio of HF and $NH_4F$ and the etching temperature are optimized, and the second hard mask film 170 remaining on the second conductive film 160 is then removed by performing the second hard mask film 170 removal process.

A dielectric film (not shown), a third conductive film (not shown) for control gate electrode, a metal film (not shown) and a gate patterning film (not shown) are formed on the whole structure. A patterning process is then performed to etch the gate patterning film, the metal film, the third conductive film and the dielectric film, thus forming a control gate electrode (not shown). The floating gate electrode 180 is then isolated, thus forming a gate electrode of a flash device which consists of the floating gate electrode 180 and the control gate electrode. At this time, it is preferred that a dielectric film having an ONO structure is used as the dielectric film. It is also preferred that a polysilicon film that is of the same kind as the first and second conductive films 30 and 60 is used as the third conductive film. Moreover, a tungsten silicide film or a tungsten film is preferably used as the metal film. A material film of a series of a nitride film can be used as the gate patterning film.

Thereafter, a predetermined ion implant process can be performed in order to form a source/drain (not shown).

Further, a gate sidewall oxidization process for compensating for damage due to the gate etching can be performed.

As described above, according to the present invention, a minute pattern is formed using a hard mask film of a series of a nitride film as an etch mask.

Further, before a hard mask film removal process is performed, the step of performing a given etching process using an oxide film etchant is added. It is thus possible to effectively remove the hard mask film by removing an abnormal oxide film on the nitride film.

In addition, generation of voids of a pattern below a hard mask film can be effectively prevented using BOE in which the composition ratio of HF and $NH_4F$ and an etching temperature are optimized as an oxide film etchant.

What is claimed is:

1. A method of manufacturing a semiconductor device, comprising the steps of:
    forming a hard mask film comprised of a nitride film on a pattern film that can easily react with an oxide film etchant chemically;
    patterning the hard mask film and then performing an etching process using the patterned hard mask film an etch mask to etch the pattern film;
    performing an etching process using a BOE solution in which HF and $NH_4F$ are mixed under the condition where the composition ratio of HF and $NH_4F$ is 1:7 to 1:10 and a temperature of the BOE solution is between 15 to 26° C. to remove a native oxide film formed on the hard mask film, wherein voids are prevented from being formed in a portion of the pattern film below the hard mask film; and
    performing a phosphoric acid dip-out process to remove the hard mask film.

2. The method as claimed in claim 1, wherein a polysilicon film or an oxide film is used as the pattern film.

3. A method of manufacturing a semiconductor device, comprising the steps of:
    performing an first ion implant process to adjust threshold voltage and to form a well region;
    depositing a tunnel oxide film, a first conductive film and a first hard mask film on a semiconductor substrate;
    patterning the first hard mask film using an isolation mask and then etching the first conductive film, the tunnel oxide film and the semiconductor substrate using the patterned first hard mask film as an etch mask to form a trench for isolation;
    forming an ion implant layer on the sidewall of the trench for preventing leakage current through the sidewall of the trench by performing a second ion implant process;
    burying the trench with an oxide film and then performing a polishing process using the first hard mask film as a stop film to form an isolation film;
    performing an etching process using a BOE solution in which HF and $NH_4F$ are mixed to remove the oxide film remaining on the first hard mask film, wherein voids are prevented from being formed in a portion of the pattern film below the hard mask film by adjusting $NH_4F$ ratio and increasing temperature of the BOE solution;
    performing a first hard mask film removal process to remove the remaining first hard mask film;
    forming a second conductive film and a second hard mask film on the whole structure;
    patterning the second hard mask film and then etching the second conductive film using the patterned second hard mask film as an etch mask;
    performing an etching process using a BOE solution in which HF and $NH_4F$ are mixed to remove the oxide film formed on the second hard mask film, wherein the etching process is carried out by controlling the ratio of $NH_4F$ within the BOE solution and raising a temperature of the BOE solution; and
    performing a second hard mask film removal process to remove the remaining second hard mask film, thus forming a floating gate electrode consisting of the first and second conductive films.

4. The method as claimed in claim 3, wherein the etching process using the BOE solution in which HF and $NH_4F$ are mixed is performed under the condition where the composition ratio of HF and $NH_4F$ is 1:7 to 1:10 and a temperature of the BOE solution is between 15 to 26° C.

5. The method as claimed in claim 3, wherein the first and second conductive films are formed using a polysilicon film, and the first and second hard mask films are formed using a nitride film.

* * * * *